United States Patent [19]

Chabries et al.

[11] Patent Number: 4,658,426

[45] Date of Patent: Apr. 14, 1987

[54] ADAPTIVE NOISE SUPPRESSOR

[75] Inventors: Douglas M. Chabries, Salem; Richard W. Christiansen, Highland; Douglas Lynn, Provo, all of Utah; Gary Kenworthy, Fremont, Calif.

[73] Assignees: Harold Antin; Mark Antin, both of New York, N.Y.

[21] Appl. No.: 785,999

[22] Filed: Oct. 10, 1985

[51] Int. Cl.⁴ ...................... H04R 27/00; H04B 15/00
[52] U.S. Cl. ......................................... 381/94; 381/93; 381/47
[58] Field of Search ....................... 381/47, 94, 93, 102

[56] References Cited

U.S. PATENT DOCUMENTS

| 4,025,721 | 5/1977 | Graupe | 381/47 |
| 4,135,590 | 1/1979 | Gaulder | 381/94 |
| 4,185,168 | 1/1980 | Graupe | 381/94 |
| 4,227,046 | 10/1980 | Nakajima | 381/47 |
| 4,468,804 | 8/1984 | Kates | 381/47 |
| 4,490,841 | 12/1984 | Chaplin | 381/94 |
| 4,493,101 | 1/1985 | Muraoka | 381/93 |

FOREIGN PATENT DOCUMENTS

60-21612 2/1985 Japan ...................................... 381/94

Primary Examiner—Gene Z. Rubinson
Assistant Examiner—L. C. Schroeder
Attorney, Agent, or Firm—David A. Blumenthal; G. Donald Weber, Jr.

[57] ABSTRACT

An adaptive noise suppressor for providing noise filtered signals. The noise suppression device employs a vector gain $\mu$ for the weights of the filter wherein the vector $\mu$ is selected for each frequency bin to be inversely proportional to the power spectrum. A projection operator is utilized to remove the effects of circular convolution to produce a linear convolution result wherein the weights are readjusted in a manner to minimize the difference between the input signal and the filter output signal, thereby minimizing the error signal to produce a noise suppressed signal in the filtered output. A frequency suppression device utilizes the same principles of the vector $\mu$ and projection operator, but the output is taken from the error output of the filter.

63 Claims, 9 Drawing Figures

ADAPTIVE NOISE SUPPRESSOR

FIELD OF THE INVENTION

The invention is in the field of adaptive noise suppression. More particularly, the invention is directed to a microprocessing controlled digital noise suppression device employing adaptive digital filtering techniques.

CROSS REFERENCE TO PRIOR ART REFERENCES

1. M. Dentino, J. McCool, and B. Widrow, "Adaptive Filtering in the Frequency Domain," Proceedings IEEE, vol. 66, pp. 1658-1659, December 1978.
2. Earl R. Ferrara, "Fast Implementation of LMS Adaptive Filters," IEEE Trans. ASSP, vol. ASSP-28, no. 4, pp. 474-5, August 1980.
3. David Mansour and A. H. Gray, Jr., "Unconstrained Frequency-Domain Adaptive Filter," IEEE Trans. ASSP, vol. ASSP-30, no. 5, pp. 726,734, October 1982.
4. S. Shankar Narayan, Allen M. Peterson, and Madihally J. Narasimha, "Transform Domain LMS Algorithm," IEEE Trans. ASSP, vol. ASSP-31, no. 3, pp. 609-615, June, 1983.
5. Gregory A. Clark, Sydney R. Parker, and Sanjit K. Mitra, "A Unified Approach to Time- and Frequency-Domain Realization of FIR Adaptive Digital Filters," IEEE Trans. ASSP, vol. ASSP-31, no. 5, pp. 1073-1083, October 1983.
6. D. Lynn, D. M. Chabries, and R. W. Christiansen, "Noise Reduction in Speech Using Adaptive Filtering I: Signal Processing Algorithms," 103rd ASA Conference, Chicago, Ill., Apr. 26, 1982.
7. Juan Carlos Ogue, Tsuneo Saito, and Yukio Hoshiko, "A Fast Convergence Frequency Domain Adaptive Filter," IEEE Trans. ASSP, vol. ASSP-31, no. 5, pp. 1312-1314, October 1983.
8. Francis A. Reed and Paul L. Feintuch, "A Comparison of LMS Adaptive Cancellers Implemented in the Frequency Domain," IEEE Trans. Circuits and Systems, vol. CAS-28, no. 6, pp. 610-615, June 1981.
9. B. Widrow, J. R. Glover, J. M. McCool, J. Kaunitz, C. S. Williams, R. H. Hearn, J. R. Zeidler, E. Dong, and R. C. Goodlin, "Adaptive Noise Cancelling: Principles and Applications," Proceedings of the IEEE, vol. 63, no. 12, pp. 1692-1716, December 1975.
10. B. Widrow, "Adaptive Filters," *Aspects of Network and system Theory,* Edited by Kalman and DeClaris, pp. 563-587, Holt, Rinehart & Winston, Inc., N.Y. 1970.
11. U.S. Pat. No. 4,238,746 to McCool et al entitled Adaptive Line Enhancer.
12. Marvin Sambur, "Adaptive Noise Cancelling for Speech Signals," IEEE Transaction on Acoustics, Speech and Signal Processing, vol. ASSP-26, no. 5, October 1978, pp. 419-423.

BACKGROUND OF THE INVENTION

Noise suppression devices have significant applications in the enhancement of narrowband spectral lines in a broadband noise field when there is a poor signal-to-noise ratio at the input and where there is insufficient a priori information on which to design appropriate filters. The device automatically filters out the components of the signal which are uncorrelated in time and passes the correlated portions. Since the properties of the device are determined solely by the input signal statistics, the properties of the filter automatically adjust to variations in the input signal statistics to obtain the least means square (LMS) approximation to a Wiener-Hopf filter. The device will thus track slowly varying spectral lines in broadband noise.

Time-domain and frequency-domain adaptive filtering techniques have been utilized with varying degrees of success to filter background noise from a desired signal, e.g., see references 1-12. While the signal can be any desired signal embedded in background noise, representative examples are speech or a signal signature indicative of the operation of machinery. Prior filtering algorithms have, however, failed to take into account the effects of circular convolutions on the filtered output signal. In speech signals, for example, such effects produce speech that sounds tinny, containing higher frequency components resulting from aliasing. In general, failure to account for the effects of circular convolutions results in noise contamination and/or signal diminution.

Noise suppression as well as feedback suppression devices have also generally failed to recognize the importance of a vector weight parameter for maintaining spectrum fidelity during signal processing. High fidelity is important in all types of signal communication, detection and identification.

SUMMARY OF THE INVENTION

It is an object of the invention to provide a method and apparatus for filtering background noise from a desired signal.

A further object of the invention is to provide a method and apparatus for removing the effects of circular convolution in an adaptive digital filter to thereby remove distortion in the desired signal.

Another object of the invention is to provide a device adapted to filter background noises from speech in real time so as to improve speech intelligibility.

Yet another object of the invention is to provide a microprocessor controlled device employing digital filtering techniques for suppressing noise and/or feedback.

Another object of the invention is to diminish the adverse effects of noise distortion in processing signals from machinery and equipment wherein the desired signal provides an indicia of wear or malfunction.

Yet a further object of the invention is to provide a method and apparatus for removing adverse noise components in signal detection equipment such as that used for detection of shipping.

The invention may be characterized as a noise suppression device comprising means for delaying an input signal X by a fixed delay; means for transforming the delayed signal into the frequency-domain; weighted means, whose input is connected to the output of the transforming means, for adaptably filtering the delayed transformed signal using a mean square algorithm in the frequency-domain; means for transforming the output of the weighted means into a time-domain signal comprising the noise filtered signal Y; means, having as inputs the signals X and Y for subtracting the signal Y from X, the output of the subtracting means being a noise error signal E; means for transforming the noise error signal $\epsilon$ into the frequency-domain to produce a transformed error signal; means for multiplying the transformed signal by a gain, projection operator means receiving the output of the multiplying means for removing the effects of circular convolution, the output of the projection operator means being fed back to the weighted means to cause the weights of the weighted means to be readjusted in a manner to minimize the difference between the signal X and the signal Y, thereby minimizing the error signal E and producing a noise suppressed filtered signal Y.

The invention may also be characterized as a feedback suppression device for providing feedback suppressed signals comprising:

(a) means for delaying an input signal X by a fixed time delay $\Delta$;

(b) first means for transforming the delayed signal into the frequency-domain;

(c) weighted means, whose input is connected to the output of the first transforming means for adaptably filtering the delayed, transformed signal using a mean square algorithm in the frequency-domain;

(d) second means for transforming the output of the weighted means into a time-domain signal comprising a signal Y;

(e) means having as inputs the signals X and Y for subtracting the signal Y from X, the output of the subtracting means being a feedback suppressed signal E;

(f) third means for transforming the signal E into the frequency-domain to produce a transformed feedback suppressed signal;

(g) means for multiplying the transformed feedback suppressed signal by a vector gain $\mu$;

(h) projection operator means receiving the output of the multiplying means for removing the effects of circular convolution, the output of the multiplying means being fed back to the weighted means to cause the weights of the weighted means to be readjusted in a manner to minimize the difference between the signals X and Y, thereby minimizing the feedback suppressed signal E.

The invention may also be embodied as a feedback suppression device comprising; means for delaying a speech input signal X by a fixed delay $\Delta$, $\Delta$ being selected to be on the order of at least a phonem; weighted means whose input is connected to the output of the delaying means for adaptably filtering the delayed signal using a least-mean-square algorithm, the output of the filtering means comprising a signal Y; means, having as inputs the signals X and Y for subtracting the signal Y from X, the output of the subtracting means being a feedback suppressed speech signal E; means having as an input signal E for multiplying the signal by a gain $\mu$, the output of the multiplying means being fed back to the weighted means to cause the weights of the weighted means to be readjusted in a manner to minimize the difference between the signal X and the signal Y, thereby minimizing the feedback suppressed speech signal E.

BRIEF DESCRIPTION OF THE DRAWINGS

The invention may be understood in reference to the detailed description set forth below taken in conjunction with the drawings wherein.

DETAILED DESCRIPTION OF THE PREFERRED EMBODIMENTS

Adaptive Filters

Adaptive filters are filters that adjust themselves automatically based on a given performance criteria. The most common such filter is the LMS adaptive filter.

Figure 1:
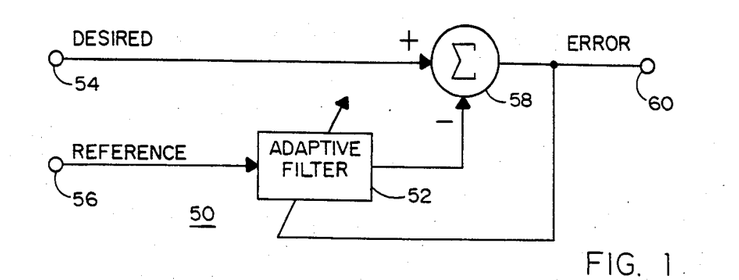
FIG. 1 is a diagram of a prior art adaptive canceller.

FIG. 1 is a block diagram of a prior art adaptive canceller 50 which has an adaptive filter 52 which adjusts itself so as to minimize the means square error between the desired input and the filter output. This filter was first proposed by Widrow et al reference (9). By analyzing the expectation of signals at various points in the structure, it can be easily shown that components of the desired input that are correlated with components of the reference input will be cancelled from the error output leaving only uncorrelated components. This structure is commonly employed in the filtering of narrow band signals, such as, for example, speech corrupted by noise. FIG. 1 illustrates a two microphone configuration wherein speech and noise signals are presented to the desired input 54, while a sample of the noise alone is presented to the reference input 56. Ideally the two noise inputs are correlated with each other while the speech and noise are uncorrelated. Thus, the noise component is removed from the signal in adder 58, leaving speech in error output 60. Any speech signal present at the reference input 56 limits the maximum possible signal to noise gain to the inverse of the speech to noise ratio at the reference input.

Figure 2:
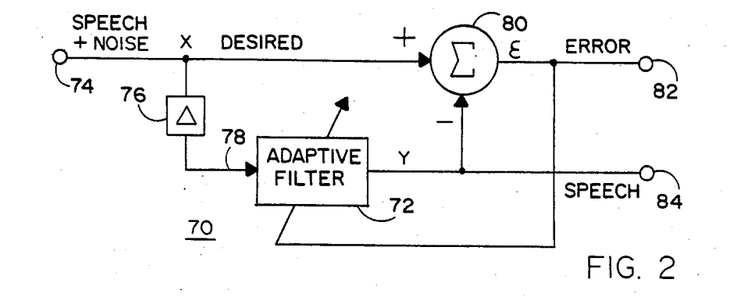
FIG. 2 is a block diagram of a prior art adaptive line enhancer.

In many applications an independent sample of the noise is typically not available. In such cases, a one microphone configuration is employed as shown by the adaptive enhancer 70 of FIG. 2. In this configuration, an adaptive filter 72 is fed a combined speech and noise signal applied from the input 74 through a delay 76. The delayed speech and noise signals thus serve as a reference input to the adaptive filter 72 and are fed thereto along line 78. The delay 76 is chosen such that the noise components of the desired and reference inputs are uncorrelated with each other while the signal components remain correlated. To minimize the mean square error, the correlated components, in this case the speech, are cancelled in adder 80 leaving noise in the error output 82, and speech in the filter output 84.

The structure of the adaptive filters 52 and 72 may comprise a standard tapped delay line filter where the error output is multiplied by a scalar gain $\mu$ and used to modify the filter weights $W_0, W_1 \ldots W_N$. Such a filter structure for adaptive filter 72 (FIG. 2) is shown in FIG. 3 and is per se well known as shown, for example in references (10) and (11).

The relationship between the mean square error and the weight values is quadratic. A plot of the mean square error against a single weight yields a parabola. Plotting the mean square error against N weights in N dimensions yields a concave hyperparaboloidal surface. To minimize the mean square error, the weights are adjusted according to the negative gradient of this error surface. The weight update consists of computing an estimate of the gradient; scaling it by a scaler adaptive learning constant, $\mu$; and subtracting this from the previous weight value.

Circular Convolution

Figure 3:
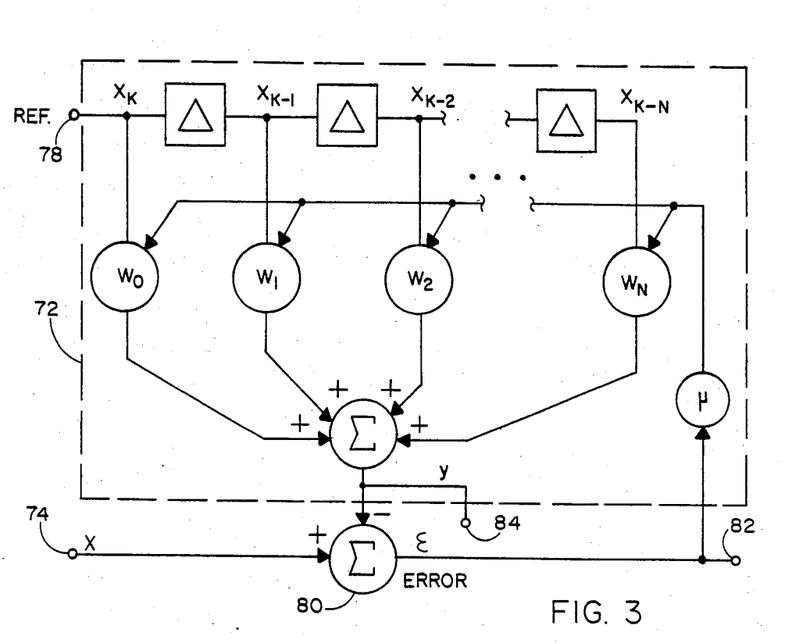
FIG. 3 is a diagram of a delay line forming part of the adaptive enhancer of FIG. 2.

In accordance with the principles of the invention, it has been recognized that noise distortion in a digital adaptive filter of the type described in FIG. 3 results from the non-periodic nature of the input signal and the utilization of the discrete FFT to perform the digital filtering. The FFT is derived from the Fourier series expansion of the signal which assumes that the input function is periodic. With this assumption, the input signal is sampled to obtain a discrete Fourier transform, the transform coefficients are then processed and the inverse discrete Fourier transform is taken on the manipulated coefficients. Ideally, it is desired to obtain the same result as if one were utilizing a non-periodic transform. Dentino (reference 1) discusses adaptive filtering in the frequency-domain but fails to adequately take into effect the circular convolution introduced by the FFT. These circular or wrap-around effects may be seen, for example, in the time-domain by considering a circular convolution of an input signal which is L samples long and utilizing a filter which is M samples long. The output of the filter is the convolution sum of $L + M$ samples. If one does a circular convolution without adding zeros prior to taking the convolution one will obtain circular or wrap-around effects which introduce harmonics of the noise which is sought to be cancelled. Moreover, the wrap-around effects are not limited solely to harmonics but may introduce sub-harmonics of the wrap-around frequency resulting from aliasing.

As set forth in detail below, and in accordance with the principles of the invention, a projection operator is utilized after the weight update to remove the effects of circular convolution.

Vector Update

An important part of applicant's invention is a vector variable, $\mu$, used as an update to the filter in combination with a projection operator to remove the effects of circular convolution. $\mu$ determines how fast the filter learns, the larger $\mu$ corresponding to the shorter learning time. However, in an adaptive filter, the faster the filter learns, the more error is present so that while the output signal appears at the filtered output 84 quickly it nevertheless contains output errors similar to noise. The faster the filter adapts, the more noise is present.

Employing a vector $\mu$, in accordance with the principles of the invention, one is able to utilize a different learning time for each frequency bin in the input spectrum. The objective is to minimize meansquare error. However, in order to preserve fidelity, the learning time constant is normalized to the power in each frequency bin. Thus, $\mu$ is selected to be inversely proportional to the power in each frequency bin. As a result, the time it takes for each frequency bin to adapt to the incoming signal is identical, that is, the filter takes the same time to learn the lower frequency as it does to learn the higher frequency components. The result is greatly improved fidelity and intelligibility since the input waveform is processed in a distortion free manner.

Utilizing a vector $\mu$ selected specifically for each bin has the advantage of enabling separate and simultaneous mean square fits for each frequency bin wherein the computations may be performed in a parallel mode.

Although the concept of a vector $\mu$ has been utilized by Mansour and Gray (reference 3) and by Narayan et al (reference 4) and Ogue et al (reference 7) these teachings do not take into account the adverse effects of circular convolutions and thus utilize erroneous computational techniques.

Time Domain Algorithm

Ferrara (reference 2) employed the FFT to obtain high speed convolution with the overlap and save technique for a block updated version of the time-domain LMS algorithm. This fast LMS algorithm required five FFT's but provided a computational savings over the time-domain implementation for moderate to very large filter lengths. The time-domain technique of Ferrara suffers from a common deficiency of all time-domain approaches in that they are too slow. Such techniques typically attempt to minimize mean-square error by taking the frequency component that has the most error and work to minimize that error first, then take the next highest error, minimizing it and so forth. When such techniques are applied to speech, for example, the lower frequency components which have the most energy are first minimized, then the intermediate frequency components, having the intermediate energy, and finally the higher frequency components which have the least energy. However, by the time the adaptive filter treats the higher frequency components there is little or no time left. For example, time-domain filters have a response time on the order of 200–300 ms which is quite long as compared to the dynamics of speech which is in the range of 20–40 ms. As a result, in time-domain filtering the background noises which appear in the higher frequency components are not effectively filtered, a result which subjectively "muffles" the speech.

Frequency-Domain Algorithm

Figure 4:
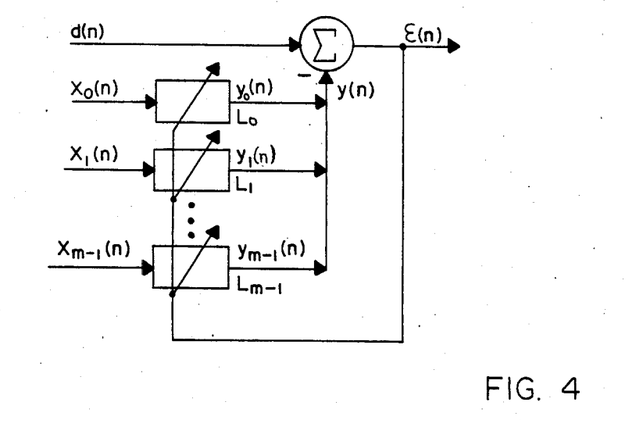
FIG. 4 is a time-domain representation of a digital adaptive filter with M references of length $L_m$.
Figure 5:
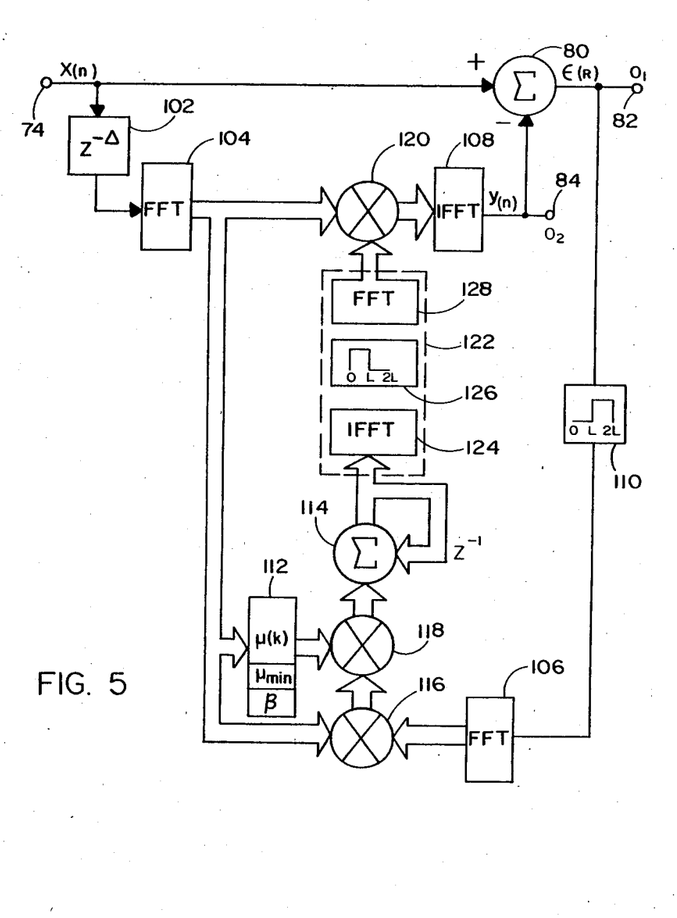
FIG. 5 is a diagram of an adaptive line enhancer in accordance with the invention.

An illustration of the noise cancellation algorithm employed in the adaptive filter enhancer is found in reference to FIGS. 4–5.

The mathematical nomenclature is introduced in reference to the classical adaptive noise cancellation problem shown in FIG. 4, and may also be found from the literature references 1–12.

Defining the primary input as d(n), the filter output y(n) and the reference inputs as $X_m(n)$, with n the sample index, the desired and reference inputs and the filter output may be divided into blocks with index k and represented by the vectors $d_L^T(k)$, $X_{Lm,m}^T(k)$ and $Y_{Lm,m}^T(k)$ as follows $$d_L^T(k) = [d(d(kL) \; d(kL+1) \ldots d(kL+1-1)] \quad (1)$$

$$X_{Lm,m}^T(k) = [X_m(kL_m) \; X_m(kL_m+1) \ldots X(kL_m+L_m-1)] \quad (2)$$

$$Y_{Lm,m}^T(k) = [Y_m(kL_m) \; Y_m(kl_m+1) \ldots Y_m(kL_m+L_m-1)] \quad (3)$$

where
$m = 0, 1, 2, \ldots, M-11$ = reference channel number
$L_m = 2^{\alpha_m}$
$L = 2^{\alpha}$
and
$\alpha, \alpha_m$ = integers specifying the block lengths.
Transforms may be obtained using the matrix $FFT_L$ as.

$$FFT_L = \begin{bmatrix} w^0 & w^0 & w^0 & \cdots & w^0 \\ w^0 & w^1 & w^2 & \cdots & w^{L-1} \\ w^0 & w^2 & w^4 & \cdots & w^{2(L-1)} \\ \vdots & & & & \\ w^0 & w^{L-1} & w^{2(L-1)} & \cdots & w^{(L-1)2} \end{bmatrix} \quad (4)$$

and $w = L^{-2\pi i/L}$. Further, let $\Psi_{2Lm,m}(k)$ represent the FFT of the $(k-1)$st and kth consecutive blocks of the mth reference given as $$\Psi_{2Lm,m}(k) = FFT_{2Lm}\begin{bmatrix} X_{Lm,m}(k-1) \\ X_{Lm,m}(k) \end{bmatrix} \quad (5)$$

and the output of the mth filter $$Y_{Lm,m}^T(k) = \text{last } L_m \text{ terms of}$$
$$FFT_{2L}^{-1}[W_{2Lm,m}(k) \otimes \Psi_{2Lm,m}(k)] \quad (6)$$

where the notation $A \otimes B$ denotes the element by element multiplication of the two vectors A and B which results in a vector. The sum of the outputs from all filters of various lengths, $L_m$, blocked to L output samples is $$Y_{L,m}(k) = \begin{bmatrix} Y_{Lm,m}(k) \\ Y_{Lm,m}(k+1) \\ Y_{Lm,m}(k+2) \\ \vdots \\ Y_{Lm,m}\left(k + \frac{L}{L_m} - 1\right) \end{bmatrix} \quad (7)$$

and $$Y_L(k) = \sum_{m=0}^{m-1} Y_{L,m}(k)$$

Similarly, the error blocked to L samples is represented by the vector equation $$E_L(k) = d_L(k) - Y_L(k) \quad (8)$$

Padding with zeroes and transforming, $$E_{2L}(k) = FFT_{2L}\begin{bmatrix} 0 \\ E_L(k) \end{bmatrix} \quad (9)$$

where the definition $$O_L^T = [0\,0\,0\,\ldots\,0]_L$$

will be used. The weight update equation using the method of steepest descents becomes $$\tilde{W}_{2Lm,m}(k+1) = (1-\rho)\tilde{W}_{2Lm,m}(k) + 2\mu(k)E_{2Lm}(k) \\ \otimes \Psi_{2Lm,m}{}^*(k) \text{ m} \quad (10)$$

where the symbol * denotes conjugation, $\rho$ specifies the rate of leakage, and the quantity $\mu(k)$ is given below, where the index k is omitted for simplicity $$\mu = \begin{bmatrix} \mu_0 & 0 & \cdot & 0 & 0 & 0 & \cdot & 0 \\ 0 & \mu_1 & \cdot & \cdot & & & & \cdot 0 \\ 0 & 0 & \cdot & \cdot & & & & \cdot 0 \\ \cdot & \cdot & \cdot & \mu_{Lm-1} & \cdot & & & \cdot 0 \\ \cdot & \cdot & \cdot & \cdot & \mu_{Lm} & \cdot & & \\ \cdot & \cdot & \cdot & \cdot & \cdot & \mu_{Lm-1} & \cdot & \cdot \\ \cdot & \cdot & \cdot & & & & & \cdot \\ 0 & 0 & 0\,0 & & 0 & 0 & \cdot & \mu_1 \end{bmatrix} \quad (11)$$

The fact that the weights have been obtained by circular convolution is denoted by $\tilde{W}$. To force the resultant output $Y_{Lm,m}(k)$ to correspond to a linear convolution, the frequency-domain weight vector is obtained from a projection operator defined as $$w_{2Lm,m}(k) = FFT_{2Lm}\left[\begin{bmatrix} I_{Lm} & O_{Lm} \\ O_{Lm} & O_{Lm} \end{bmatrix} FFT_{2Lm}^{-1}[\tilde{w}_{2Lm}(k)]\right] \quad (12)$$

where $I_{Lm}$ is the $L_m \times L_m$ identity matrix. The truncation of the weight vector in equation (12) insures that the last half of a time-domain representation of the weights is identically zero.

The weight vector corresponding to the mth reference, $W_{2Lm,m}(k)$, is updated once each $L_m$ samples and the output vector $Y_{Lm,m}(k)$ is obtained from equation (6). Y(n) in FIG. 5 represents one of the elements of the vector $Y_{Lm,m}^T(k)$.

The addition of the vector feedback coefficients, $\mu$, in the general algorithm allows faster convergence for the cases where the reference input autocorrelation matrix exhibits large eigenvalue disparity. One technique for selecting the values of $\mu(k)$ which make up $\mu$ is described in (reference 7):

$$\mu(k) = \left[\mu^{-1}(o) + \sum_{i=1}^{k} \text{diag}[\Psi_{2Lm,m}(i) \otimes \Psi_{2Lm,m}^*(i)]\right]^{-1} \quad (13)$$

A preferred embodiment for selecting $\mu(k)$ which is robust in rapidly changing, non-stationary problems is to select a $\mu_{min}$ which represents a bound on the minimum values that $\mu$ will take on in each frequency bin and average exponentially as $$\mu(k) = [\mu_{min}^{-1} + \lambda\{diag[\Psi_{2Lm,m}(k) \otimes \Psi_{2Lm,m}^*(k-1)]\} + \beta\mu^{-1}(k-1)]^{-1} \quad (14)$$

The value for $\beta$ may be chosen to achieve an exponentially averaged time constant for $\mu$ of approximately $[1-\beta]^{-1}$. The choice of $\lambda$ controls the rate of convergence for those frequency bins where $\lambda$ times the respective eigenvalue of $diag]\Psi_{2Lm,m}(k) \otimes \Psi_{2Lm,m}^*(k)]$ are much greater than the same component of $\mu_{min}$. This implementation of $\mu(k)$ equation (14) tends to normalize the convergence rate in each frequency bin to a common time constant.

The algorithm in equations (1)-(14) allows an ALE to be implemented which incorporates a vector $\mu$ and preserves the constraint intended by the delay in the reference channel. Additionally, the value of $\mu$ may be allowed to vary in the case of non-stationary inputs. Such a feature becomes important in speech modelling, for example, where the speech spectrum is not white and inputs are non-stationary.

In the application of the algorithm to the processing of speech signals, three considerations are of special importance:
1. the rate of learning may be selected by choosing $\beta$ in equation (14) and the rate should be set equal to the "forgetting" rate determined by $\rho$ in equation (10).
2. the amount of delay in the adaptive line enhancer of FIG. 5 should be set in the range of 1-3 ms and most preferably at about 1 ms.
3. the selection of $\mu_{min}$ should be chosen to vary inversely as the energy in the speech spectrum to be processed.

The formulation of the general frequency-domain algorithm in equations (1)-(14) allows the implementation of these features.

FIG. 5 is a block diagram for an adaptive noise suppresser showing data flow in accordance with equations (1)-(14). The adaptive noise suppresser may be utilized for example as an adaptive line enhancer (ALE). Features of FIG. 5 in common with FIG. 2 have been similarly labeled, and include input 74, error output 82, filter output 84 and adder 80. The adaptive noise suppresser of FIG. 5 is also seen to comprise a delay 102, FFT 104 and 105, IFFT 108, window 110 vector $\mu$ calculating device 112, summer 114, vector multipliers 116, 118 and 120 and a projection operator 122. Window 110 serves to zero the first L terms of the error output as per equation (9). The vector $\mu$ calculating device 112 determines the value of the vector $\mu(k)$ in accordance with equation (14) utilizing stored values for $\mu_{min}$ and $\beta$. Vector multipliers 116, 118 and 120 perform the element by element, outer product vector multiplication. Multiplier 120 forms the weighted means for multiplying the frequency coefficients of FFT 104 by the vector weights to permit adaptive filtering using a mean square algorithm. The projection operator 122 serves to remove the effects of circular convolution to provide an output which corresponds to a linear convolution. The projection operator is defined by equation (12) and is seen to comprise IFFT 124, window 126 and FFT 128. Window 126 operates to zero the last L terms of data and is effective for removing circular convolution effects.

The loop identified by $Z^{-1}$ in FIG. 5 represents the feedback of the previous weight as called for in equation (10).

The noise suppressed signal is taken at filter output 84.

Figure 6:
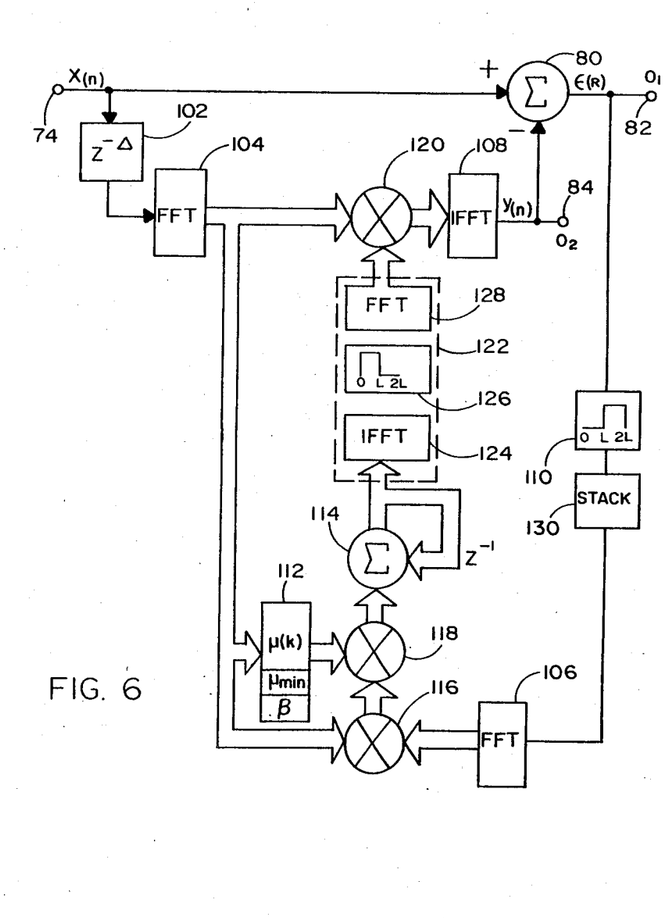
FIGS. 6-7 are other embodiments of the adaptive line enhancer similar to that of FIG. 5.

An alternate embodiment of the invention is illustrated in FIG. 6 which is identical to FIG. 5 with the exception of a stack 130 positioned after window 110. The stack is a memory store which serves to store the windowed data and to combine it with a second group of windowed stored data so that a full block of data may be fed to the FFT 106. In combining the two groups of data, the groups are simply placed adjacent one another to produce a full block of data without the added zeros. In so doing, equation (9) is replaced by:

$$E_{2L}(k) = FFT_{2L}\begin{bmatrix} E_L(k-1) \\ E_L(k) \end{bmatrix} \quad (15)$$

Stacking has been found to introduce negligible effects due to aliasning. Data stacking is not necessary but will allow a more efficient operation in performing the FFT 106, thus reducing power consumption.

Figure 7:
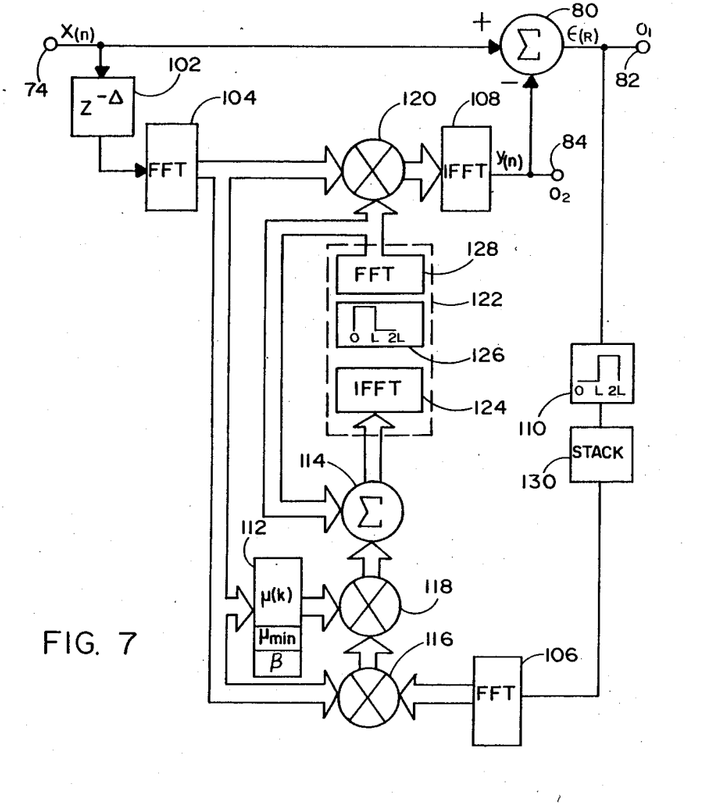

Yet another embodiment of the invention is illustrated in FIG. 7. This embodiment is similar to FIG. 6 but the delayed weight sample is now taken after the projection operator 122. In this case, equation (10) is replaced by:

$$\tilde{W}_{2L_{m,m}}(k+1) = (1-\rho)\tilde{W}_{2L_{m,m}}(k) + 2\mu(k)E_{2L_m}(k) \cdot \otimes \Psi_{2L_{m,m}}*(k)$$

In FIG. 7, the stack 130 is optional and may be removed to achieve a similar embodiment as in FIG. 5 using equation (9).

In implementing the invention in accordance with the block diagram of FIGS. 5-7 care must be taken in selecting the delay 102. Most noise is impulsive in nature resembling a click or tap. This impulsive noise is very short lived, and after passing through even a short delay 102 will be uncorrelated with the desired (undelayed) signal inputted into adder 80. That is, the impulsive noise in the undelayed channel will already have passed through the adder 80 by the time delayed impulse arrives thereto. Desired signals however, typically have a great deal of redundancy and are much longer lived than impulsive noise. As a result, the delayed desired signal arriving at the adder 80 is still correlated with the undelayed input.

An important aspect of the invention is the proper selection of the delay 102. It has been suggested, for example, that the delay in adaptive filters for speech processing be chosen to be equal to a pitch period which is approximately 8 ms, e.g., reference 12. However, in accordance with the invention it has been found that the delay of a pitch period, while suitable for vowels is not suitable for fricatives or plosive sounds. Such sounds are destroyed by the large delay making it difficult to distinguish, for example, "tired" from "dired." Thus, the s, sh, d, t, may be largely confused and non-distinguishable. In accordance with the invention speech intelligibility is greatly improved by selecting the delay to be on the order of less than a pitch period, preferably in the range of 1-3 ms and most preferably to be about 1 ms. Such selection will preserve speech intelligibility for all sounds, especially for plosive and fricative sounds.

For suppression of background noise in the detection of surface shipping sounds, it is desirable to select the delay 102 to be on the order of or greater than 10 ms. For detection of submarine radiated noise a delay on the order of or greater than 100 ms is preferable. Such delays serve to decorrelate undesired background noise but leave the desired signal highly correlated.

A further application of the invention relates to the detection of noise signatures in rotating machines to detect wear and/or malfunction of moving, typically rotating, parts. For example, characteristic sound signatures are eminated in the form of loud harmonic radiation from rotating bearings. The delay is chosen to allow correlation of the anticipated radiated noise signature of the failed or worn component of the machinery while decorrelating the background noise of the normally operating machinery. If the anticipated failed signature is assumed to have a bandwidth of about 100 milliHertz and the normal background is white Gaussian noise, then the delay may be chosen to be greater than one sample (thereby decorrelating the noise) and less than 10 seconds (the delay that decorrelates the anticipated failure signature $-1/100$ milliHertz).

A particular application of the frequency domain noise suppressor obtained by proper selection of the delay is the cancellation of reverberation or echoes. In speech communication (over the telephone, for example), a value for the delay is selected to be less than the time delay for the first expected echo which comprises the reverberant energy at the receiver. The block length used in the frequency domain filter is chosen to be greater than twice the reverberation time constant for best performance. By selecting the delay to be slightly less than the arrival time for the first echo, the filter is able to adaptively cancel subsequent echo returns by using the front of the incoming speech signal to cancel the echo. The error output 82' of the filter is then the signal output which becomes the desired "de-reverberanted" signal.

The important feature in the selection of the time delay is to use the value for the delay which allows the maximum difference in the value of the correlation of the desired signal as compared to the value of the correlation of the undesired signal.

Another aspect of the invention especially suitable for speech processing is to utilize a leak factor $\rho$ as per equation (10) so as to make the filter forgetting time the same as the filter learning time. It has been noted that absent a leak factor, noise reverberation builds up at the output of the filter especially at the end of a word. This reverberation has much the same effect as a jet aircraft passing overhead, i.e., it produces a shshsh sound at the end of every word. The reverberation takes place because at the end of a word there is zero or very little energy entering a particular frequency bin. If there is no forgetting time, the filter weights are maintained and subsequent residual noise coming through the filter is amplified with the existing weights resulting in the reverberation. In accordance with the invention filter is amplified with the existing weights resulting in the reverberation. In accordance with the invention a "leak" constant $\rho$ representation of the weight forgetting time is utilized as a multiplier of the weights in computing the updated weights. Further, a minimum $\mu$, $\mu_{min}$ is selected such that the updated $\mu$ will be equal to $\mu_{min}$ plus a calculated value of $\mu$. This $\mu_{min}$ is important to prevent an over compensation of the filter weights which would result with a zero or very little energy content within a particular frequency bin. For example, since $\mu$ is selected to be inversely proportional to the power within a particular frequency bin, a zero power within a particular bin will result in an infinite (very large) choice for $\mu$. On the next sample, however, a relatively small amplitude signal will be multiplied by the infinite (very large) $\mu$ resulting in over compensation and undesirable noise. In bins where there is very little speech for any length of time, the frequency spectrum in these bins tends to become very noisy. Introduction of $\mu_{min}$, however, eliminates this noise background and eliminates the over compensation. Further, the value of $\mu_{min}$ may be selected to be different for each frequency bin and may be chosen to be inversely proportional to the power spectrum of speech.

Feedback Suppression

Figure 8:
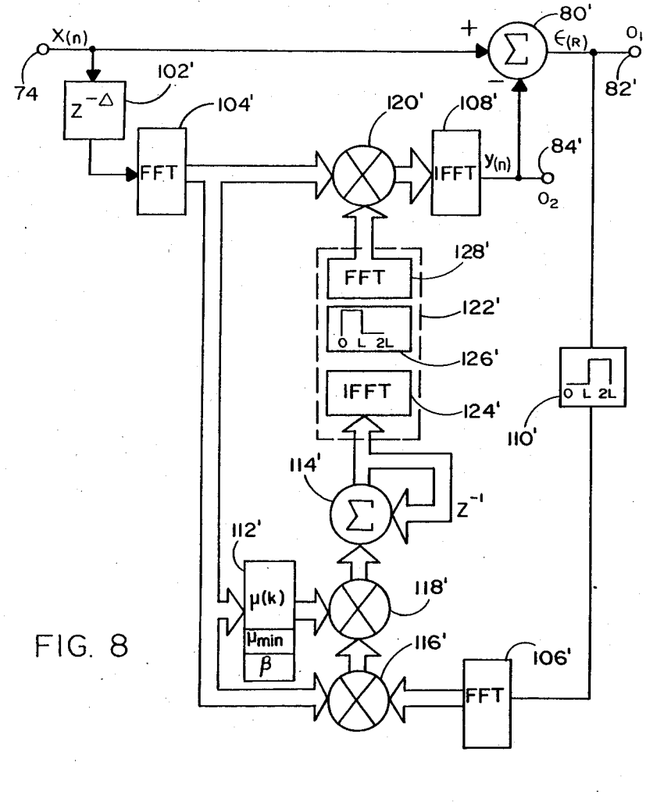
FIG. 8 is another embodiment of the invention suitable for feedback suppression and similar to that of FIG. 5.

A feedback suppression device is illustrated by the block diagram of FIG. 8. It is noted that FIG. 8 is similar to FIG. 5 and the corresponding elements have been identified utilizing primed numbers. The formula in equations (1)–(14) also apply; however, for the frequency suppression device the output is taken from the error output 82' rather than the filter output 84'. Furthermore, delay 102' now replaces delay 102. Delay 102' is selected to filter out feedback squeal and is selected to be relatively large, as for example, on the order of 100 ms. With these modifications, the details of the filter algorithm utilized to implement FIG. 8 are the same as those shown in FIG. 5 with regard to noise suppression.

For speech processing, it is important to select the delay 102' in FIG. 8 to be at least greater than one phonem. Typically the length is selected to be 50–150 ms so that the delay 102' should be on the order of 50 ms or greater. Preferably, the delay should be in the range of 50–500 ms with the more preferred range of 75–125 ms. Most preferably the delay should be selected at approximately 100 ms. Typical speech phonems are stationary on the order of about 20–40 ms so that the selection of 100 ms typically ensures that the phonem (or word) in the delayed and undelayed channels are completely uncorrelated by the time they are summed in adder 80'. Feedback squeal on the other hand will still be present in both the delayed and undelayed channels so that they will be correlated and summed to zero in the adder 80' providing a feedback free signal at output 82'.

The utilization of a vector $\mu$ in FIG. 8 is quite important in controlling the fidelity of the frequency spectrum just as in the case of the noise suppression device of FIG. 5. The utilization of a vector $\mu$ in accordance with equations 1–14 above does not represent a LMS algorithm but is rather a meansquare algorithm in the frequency-domain. Effectively, the algorithm minimizes mean-square error concurrently within each frequency bin. The result is not necessarily the same as a minimization of the total mean-square error. For the feedback application the utilization of the vector $\mu$ enables the filter to response very quickly to the feedback squeal before it in fact develops into a large enough amplitude to be notices. Thus, rather than utilizing a scaler $\mu$ and treating the total frequency spectrum by concentrating on only the higher energy components first and then treating the lower energy components etc. one is able to treat all frequency bins at the same time to minimize error within each bin concurrently. The would be feedback squeal is filtered at its very inception so that it never really develops into any noticeable squeal. As in noise suppression, $\mu$ is selected such that the learning time for all frequency bins is identical.

The feedback suppression device of FIG. 8 may be modified in a similar manner as set forth above in connection with the noise suppression device of FIGS. 6 and 7.

Non-limiting examples of applications of the feedback suppression device of FIG. 8 are found in loud speaker systems, audio amplification networks and hearing aids.

It is also noted, that the feedback suppression may be implemented in the time-domain as long as the delay is selected to be equal to or greater than 100 ms. Time-domain feedback suppression may utilize the techniques exemplified in reference 11 with the delay 102' selected as indicated above and with the output taken from the error output 82'. In this case, the adaptive filter would essentially be represented by the embodiment of FIG. 3 utilizing tapped delay lines.

For this time domain feedback suppression embodiment, it is also important to select the number of weights in the adaptive filter to be relatively small, namely between 16 and 32 weights and most preferably at approximately 22 weights. Such a relatively small number of weights is desirable because of the nature of the feedback tone which may center around a band of frequencies. For example, assuming that the initial frequency squeal occurs at $f_0$, the adaptive filter basically serves as a notch filter at frequency $f_0$ to eliminate the squeal. If the frequency contains a lot of weights and has a great deal of resolution it will specifically remove the frequency $f_0$. However, if the environment of the hearing aid changes, as for example by the user placing an object next to the ear, the filter is so finely tuned that a small change in the frequency feedback typically puts the squeal outside of the filter notch and the squeal begins to appear even though at a slightly different frequency. A high resolution filter will then have to relearn and readjust the notch to the new feedback frequency. This relearning takes time, and the higher the filter resolution the longer time it takes. It is thus desirable, in accordance with the invention, to produce a broad notch filter with a relatively small number of weights. Such a design will not distinguish between small changes in the feedback frequency and will thus eliminate a broader range of feedback signals without having to readjust the filter weights for each change in environment.

Figure 9:
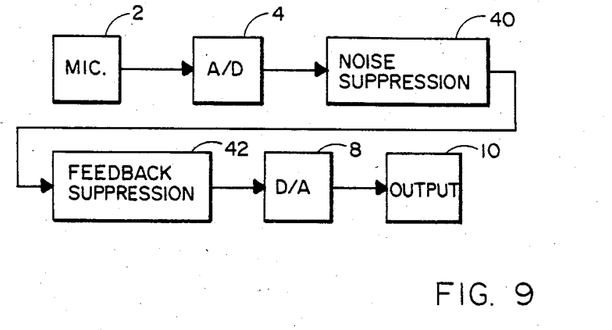
FIG. 9 is a block diagram of noise and frequency suppressers incorporated in a hearing aid device.

The embodiment of the invention shown in FIG. 9 incorporates a noise suppression device 40 and a feedback suppression device 42 into a hearing aid having a microphone 200, A/D converter 400, D/A converter 600 and output device 800. The hearing aid device may typically be designed utilizing a microprocessor or large scale integrated circuits such that the entire device may be small enough to be fitted into the ear as in present day hearing aids. The output device 800 may be a speaker or earphone for transmitting the final analog output of the hearing aid to the eardrum of the hearing aid user. The adaptive speech enhancer 100 of FIG. 5 and the feedback suppression device of FIG. 8 may be utilized to form the respective noise suppression device 40 and feedback suppression device 42 of FIG. 10. It is understood that the embodiment of FIG. 9 may be utilized with only one or both of these noise and feedback suppression devices as they operate independently of one another. Moreover, it is understood that noise suppression device 40 as well as feedback suppression device 42 may be implemented in the form of a program algorithm, either software or firmware stored in the memory of a microprocessor. Moreover, the microprocessor may be a conventional single chip microprocessor or a specially designed LSI or VLSI circuit operable to perform the noise and feedback suppression as set forth herein. Reference to individual "devices" in reference to the functions of the noise and feedback elements is simply a term to facilitate the explanation of the individual components and does not necessarily imply that these components must appear on separate and distinct integrated circuits.

When the noise suppression device 40 and feedback suppression device 42 are arranged in series as shown in FIG. 9, it is only necessary to take the output 84 of FIG. 5 (the noise suppressed output) and feed it as an input signal into the input 74' of FIG. 8. The error output 82' will then represent not only the noise suppressed output but also the feedback suppressed output as desired. Alternately, the order of noise and feedback suppression may be reversed such that frequency suppression is performed first. In the latter case, the output 82' of FIG. 8 is fed as to input 74 of FIG. 5 with the output taken at output 84.

If feedback suppression is implemented in the frequency-domain as shown in FIG. 8, and is further utilized with the noise suppression device of FIG. 5, it is not necessary to take the IFFT 108 in FIG. 5 and then take the FFT 104' in FIG. 8. Rather, some savings may be made by taking the output of the multiplier 120 of FIG. 5, and feeding it directly to the input 74' of FIG. 8. The FFT 104' of FIG. 8 will then be eliminated thus permitting computational savings in taking the inverse and its transform to achieve the noise and feedback suppression.

It is understood that the arrangement shown in FIG. 9 for the hearing aid device may take many forms and does not have to be embodied in the exact forms shown. For example, feedback suppression device 42 may precede the noise suppression device 40. Further, the combination of the noise and feedback suppression devices is not limited to hearing aids but has broad applicability in processing any desired signal where both noise and feedback are to be suppressed.

The invention has many applications which are not limited to those enumerated herein. Further, while the invention has been described in reference to various embodiments, it is understood that many modifications and improvements may be made by those skilled in the art without departing from the scope of the novel concepts and teachings of the present invention.

What is claimed is:

1. A noise suppression device for providing a noise filtered speech signal comprising:
   means for delaying an input signal X by a fixed delay $\Delta$;
   means for transforming the delayed signal into the frequency domain;
   weighted means, having weights and having inputs connected to the transforming means, for adaptably filtering the delayed, transformed signal using a mean square algorithm in the frequency domain;
   means for transforming the output of the weighted means into a time domain signal comprising the noise filtered speech signal Y;
   means, having as inputs the signals X and Y for subtracting the signal Y from X, the output of the subtracting means being a noise error signal $\epsilon$;
   means for transforming the noise error signal $\epsilon$ into the frequency domain to produce a transformed error signals;
   means for multiplying the transformed noise error signals by a vector gain $\mu$;
   projection operator means receiving the output of the multiplying means for removing the effects of circular convolution, the output of the projection operator means being fed back to the weighted means to cause the weights of the weighted means to be readjusted in a manner to minimize the difference between the signal X and the signal Y, thereby minimizing the error signal and producing a noise suppressed signal in the filtered signal Y.

2. A noise suppression device as recited in claim 1, wherein $\Delta$ is on the order of 1-3 ms.

3. A noise suppression device as recited in claim 2, wherein $\Delta$ is on the order of 1 ms.

4. A noise suppression device as recited in claim 1, wherein the vector gain $\mu$ is selected in each frequency bin of the frequency spectrum to be inversely proportional to the power in the frequency spectrum, whereby spectrum fidelity is preserved.

5. A noise suppression device as recited in claim 1, wherein said signals X, Y, and $\epsilon$ comprise a plurality of digital signals representing a sampled group of signal and noise data and said device further comprises means for zeroing the last half of the ϵ data signals in the sampled group of data for providing zeroed ϵ data signals to said noise error signal transforming means and wherein said transforming means receive said zeroed ϵ data signals for transforming same into the frequency domain.

6. A noise suppression device as recited in claim 5 further comprising means for combining a second group of zeroed ϵ data signals at the end of a first group of zeroed ϵ data signals for producing a full group of ϵ data signals for providing same to said noise error signal transforming means and wherein said transforming means receives said full group of ϵ data signals for transforming same into the frequency domain.

7. A noise suppression device as recited in claim 5, wherein said projection operator means comprises means for zeroing the last half of the weights in the time domain.

8. A noise suppression device as recited in claim 6, wherein said projection operator means comprises means for zeroing the last half of the weights in the time domain.

9. A noise suppression device as recited in claim 4, wherein said signals X, Y, and ϵ comprise a plurality of digital signals representing a sampled group of signal and noise data and said device further comprises means for zeroing the last half of the ϵ data signals in the sampled group of data for providing zeroed ϵ data signals to said noise error signal transforming means and wherein said transforming means receive said zeroed ϵ data signals for transforming same into the frequency domain.

10. A noise suppression device as recited in claim 2, wherein the vector gain $\mu$ is selected in each frequency bin of the frequency spectrum to be inversely proportional to the power in the frequency spectrum.

11. A noise suppression device as recited in claim 3, wherein the vector gain $\mu$ is selected in each frequency bin of the frequency spectrum to be inversely proportional to the power in the frequency spectrum.

12. A noise suppression device as recited in claim 1, further comprising means for multiplying said weights by a leak factor $\rho$ so as to decrease the value of said weights in inverse proportion to the power in the frequency spectrum.

13. A noise suppression device as recited in claim 1, wherein a minimum value of $\mu$ is set for each frequency bin.

14. A noise suppression device as recited in claim 1, wherein $\Delta$ is on the order of less than a pitch period.

15. A method of noise suppression for providing a noise filtered signal comprising the steps of:
(a) delaying an input signal X by a fixed delay $\Delta$;
(b) transforming the delayed signal into the frequency domain;
(c) adaptably filtering the delayed, transformed signal using a plurality of weights and a mean square algorithm in the frequency domain to provide a filtered output signal;
(d) transforming the filtered output signals into a time domain signal comprising the noise filtered signal Y;
(e) subtracting the signal Y from X for obtaining a noise error signal ϵ;
(f) transforming the noise error signal ϵ into the frequency domain to produce a transformed error signals;
(g) multiplying the transformed noise error signals by a vector gain $\mu$;

(h) removing the effects of circular convolution from the multiplied noise error signal; and
(i) feeding back the results of step (h) to adjust the weights in the mean square algorithm in a manner to minimize the difference between the signal X and the signal Y, thereby minimizing the error signal ϵ and producing noise suppressed signals in the noise filtered signal Y.

16. The method of claim 15, wherein the step of delaying the input signal comprises delaying the input signal on the order of 1–3 ms.

17. The method of claim 15, wherein the step of delaying the input signal comprises delaying the input signal on the order of 1 ms.

18. The method of claim 15 further comprising the step of selecting the vector gain $\mu$ in each frequency bin of the frequency spectrum to be inversely proportional to the power in the frequency spectrum, whereby spectrum fidelity is preserved.

19. The method of claim 15, wherein said signals X, Y, and ϵ comprise a plurality of digital signals representing a sampled group of signal and noise data and, after said subtracting step (e), said method further comprises the step of zeroing the first half of the ϵ data signals in the sampled group of data for providing zeroed ϵ data signals for transforming in accordance with step (f).

20. The method of claim 19 further comprising the steps of:
combining a second group of zeroed ϵ data signals at the end of a first group of zeroed ϵ data signals for producing a full group of ϵ data signals; and
providing said full group of ϵ data signals for transforming same in accordance with step (f).

21. The method of claim 19, wherein step (h) comprises the step of zeroing the last half of the weights in the time domain.

22. The method of claim 20, wherein step (h) comprises the step of zeroing the last half of the weights in the time domain.

23. The method of claim 18, wherein said signals X, Y, and ϵ comprise a plurality of digital signals representing a sampled group of signal and noise data and, after said subtracting step (e), said method further comprises the step of zeroing the first half of the ϵ data signals in the sampled group of data for providing zeroed ϵ data signals for transforming in accordance with step (f).

24. The method of claim 16 further comprising the step of selecting the vector gain $\mu$ in each frequency bin of the frequency spectrum to be inversely proportional to the power in the frequency spectrum, whereby spectrum fidelity is preserved.

25. The method of claim 17 further comprising the step of selecting the vector gain $\mu$ in each frequency bin of the frequency spectrum to be inversely proportional to the power in the frequency spectrum, whereby spectrum fidelity is preserved.

26. The method of claim 15 further comprising, after step (f), the step of multiplying said weights by a leak factor $\rho$ so as to decrease the value of said weights in inverse proportion to the power in the frequency spectrum.

27. The method of claim 15 further comprising, after step (f), the step of selecting a minimum value of $\mu$ for each frequency bin.

28. The method of claim 15, wherein the step of delaying the input signal comprises delaying the input signal on the order of less than a pitch period.

29. A feedback suppression device for providing feedback suppressed signals comprising:
  (a) means for delaying an input speech signal X by a fixed time delay $\Delta$;
  (b) first means for transforming the delayed signal into the frequency domain;
  (c) weighted means, having weights and having inputs connected to the first transforming means for adaptably filtering the delayed, transformed signal using a mean square algorithm in the frequency domain;
  (d) second means for transforming the output of the weighted means into a time domain signal comprising a signal Y;
  (e) means having as inputs the signals X and Y for subtracting the signal Y from X, the output of the subtracting means being a feedback suppressed signal $\epsilon$;
  (f) third means for transforming the signal $\epsilon$ into the frequency domain to produce a transformed feedback suppressed signals;
  (g) means for multiplying the transformed feedback suppressed signal by a vector gain $\mu$; and
  (h) projection operator means receiving the output of the multiplying means for removing the effects of circular convolution, the output of the projection operator means being fed back to the weighted means to cause the weights of the weighted means to be readjusted in a manner to minimize the difference between the signals X and Y, thereby minimizing the feedback suppressed signal $\epsilon$.

30. A feedback suppression device as recited in claim 29, wherein the number of weights of said weighted means is in the range of 16-32 weights.

31. A feedback suppression device as recited in claim 29, wherein the number of weights is about 22.

32. A feedback suppression device as recited in claim 29, wherein $\Delta$ is on the order of 100-500 ms.

33. A feedback suppression device as recited in claim 29, wherein $\Delta$ is about 100 ms.

34. A feedback suppression device as recited in claim 30, wherein $\Delta$ is on the order of 50-500 ms.

35. A feedback suppression device as recited in claim 28, wherein $\Delta$ is about 100 ms.

36. A feedback suppression device as recited in claim 31, wherein $\Delta$ is on the order of 50-500 ms.

37. A feedback suppression device as recited in claim 31, wherein $\Delta$ is about 100 ms.

38. A feedback suppression device as recited in claim 29, wherein $\Delta$ is on the order of 50-500 ms.

39. A feedback suppression device as recited in claim 29, wherein said signals X, Y, and $\epsilon$ comprise a plurality of digital signals representing a sampled group of signal and feedback data and said device further comprises means for zeroing the first half of the $\epsilon$ data signal in the sampled group of data for providing zeroed $\epsilon$ data signals to said third transforming means and wherein said third transforming means receives said zeroed $\epsilon$ data signals for transforming same into the frequency domain.

40. A feedback suppression device as recited in claim 39 further comprising means for combining a second group of zeroed $\epsilon$ data signals at the end of a first group of zeroed $\epsilon$ data signals for producing a full group of $\epsilon$ data signals for providing same to said third transforming means and wherein said third transforming means receives said full group of $\epsilon$ data signals for transforming same into the frequency domain.

41. A feedback suppression device as recited in claim 29, wherein said projection operator means comprises means for zeroing the last half of the weights in the time domain.

42. A feedback suppression device as recited in claim 40, wherein said projection operator means comprises means for zeroing the last half of the weights in the time domain.

43. A feedback suppression device as recited in claim 38, wherein said signals X, Y, and $\epsilon$ comprise a plurality of digital signals representing a sampled group of signal and feedback data and said device further comprises means for zeroing the first half of the $\epsilon$ data signal in the sampled group of data for providing zeroed $\epsilon$ data signals to said third transforming means and wherein said third transforming means receives said zeroed $\epsilon$ data signals for transforming same into the frequency domain.

44. A feedback suppression device as recited in claim 40, wherein $\Delta$ is on the order of 50-500 ms.

45. A feedback suppression device as recited in claim 41, wherein $\Delta$ is on the order of 50-500 ms.

46. A feedback suppression device as recited in claim 29 further comprising means for multiplying said weights by a leak factor $\rho$ so as to decrease the value of said weights in inverse proportion to the power in the frequency spectrum.

47. A feedback suppresion device as recited in claim 29, wherein $\Delta$ is selected to be on the order of at least greater than a phonem.

48. A method of feedback suppression to provide feedback suppressed signals comprising the steps of:
  (a) delaying an input signal X by a fixed time delay $\Delta$;
  (b) transforming the delayed signal into the frequency domain;
  (c) adaptably filtering the delayed, transformed signal using a plurality of weights and a mean square algorithm in the frequency domain to provide filtered output signals;
  (d) transforming the filtered output signals of the weighted means into a time domain signal comprising a signal Y;
  (e) subtracting the signal Y from X for obtaining a feedback suppressed signal $\epsilon$;
  (f) transforming the signal $\epsilon$ into the frequency domain to produce a transformed feedback suppressed signals;
  (g) multiplying the transformed feedback suppressed signal by a vector gain $\mu$;
  (h) removing the effects of circular convolution from the multiplied noise error signal; and
  (i) feeding back the results of step (h) to adjust the weights in the mean square algorithm in a manner to minimize the difference between the signals X and Y, thereby minimizing the feedback suppressed signal $\epsilon$.

49. The method of claim 48, wherein the step of delaying comprises delaying the input signal on the order of at least greater than a phonem.

50. The method of claim 48, wherein the step of delaying the input signal comprises delaying the input signal on the order of 50-500 ms.

51. The method of claim 48, wherein said signals X, Y, and $\epsilon$ comprise a plurality of digital signals representing a sampled group of signal and feedback data and, after step (e), said method further comprises the step of zeroing the first half of the $\epsilon$ data signal in the sampled group for transforming in accordance with step (f).

52. The method of claim 48 further comprising, after step (f), the step of multiplying said weights by a leak factor $\rho$ so as to decrease the value of said weights in inverse proportion to the power in the frequency spectrum.

53. The method of claim 27 further comprising, after step (f), the step of selecting a minimum value of $\mu$ for each frequency bin.

54. A time domain feedback suppression device comprising:
- means for delaying a speech input signal X by a fixed delay $\Delta$, $\Delta$ being selected to be on the order of at least greater than a phonem;
- weighted means having weights and having inputs connected to the delaying means for adaptably filtering the delayed signal using a least-mean-square algorithm, the output of the filtering means comprising a signal Y;
- means, having as inputs the signals X and Y for subtracting the signal Y from X, the output of the subtracting means being a feedback suppressed speech signal $\epsilon$;
- means having as an input signal $\epsilon$ for multiplying the signal by a gain $\mu$, the output of the multiplying means being fed back to the weighted means to cause the weights of the weighted means to be readjusted in a manner to minimize the difference between the signal X and the signal Y, thereby minimizing the feedback suppressed speech signal $\epsilon$.

55. A feedback suppression device as recited in claim 54, wherein the number of weights of said weighted means is in the range of 16-32 weights.

56. A feedback suppression device as recited in claim 55, wherein the number of weights is about 22.

57. A feedback suppression device as recited in claim 54, wherein $\Delta$ is on the order of 50-500 ms.

58. A feedback suppression device as recited in claim 54, wherein $\Delta$ is about 100 ms.

59. A feedback suppression device as recited in claim 55, wherein $\Delta$ is on the order of 50-500 ms.

60. A feedback suppression device as recited in claim 54, wherein $\Delta$ is about 100 ms.

61. A feedback suppression device as recited in claim 56, wherein $\Delta$ is on the order of 50-500 ms.

62. A feedback suppression device as recited in claim 56, wherein $\Delta$ is about 100 ms.

63. A method of feedback suppression comprising the steps of:
- delaying a speech input signal X by a fixed delay $\Delta$, $\Delta$ being selected to be on the order of at least a phonem;
- adaptably filtering the delayed signal using a plurality of weights and a least-mean-square algorithm, the output of the filtering means comprising a signal Y;
- subtracting the signal Y from X, for providing a feedback suppressed speech signal $\epsilon$;
- multiplying the feedback suppressed speech signal $\epsilon$ by a gain $\mu$; and
- feeding back to the weighted means to cause the weights of the weighted means to be readjusted in a manner to minimize the difference between the signal X and the signal Y, thereby minimizing the feedback suppressed speech signal $\epsilon$.

* * * * *